United States Patent
Torvik

(10) Patent No.: US 6,632,694 B2
(45) Date of Patent: Oct. 14, 2003

(54) DOUBLE HETEROJUNCTION LIGHT EMITTING DIODES AND LASER DIODES HAVING QUANTUM DOT SILICON LIGHT EMITTERS

(75) Inventor: John Tarje Torvik, Louisville, CO (US)

(73) Assignee: Astralux, Inc., Boulder, CO (US)

( * ) Notice: Subject to any disclaimer, the term of this patent is extended or adjusted under 35 U.S.C. 154(b) by 0 days.

(21) Appl. No.: 10/273,041

(22) Filed: Oct. 17, 2002

(65) Prior Publication Data

US 2003/0071275 A1 Apr. 17, 2003

Related U.S. Application Data

(60) Provisional application No. 60/329,882, filed on Oct. 17, 2001.

(51) Int. Cl.[7] .............................................. H01L 21/20
(52) U.S. Cl. ........................... 438/22; 438/47; 438/456
(58) Field of Search ................................. 438/21, 22, 42, 438/46, 47, 455, 456, 597, 602, 931

(56) References Cited

U.S. PATENT DOCUMENTS

| | | | | |
|---|---|---|---|---|
| 3,309,553 | A | 3/1967 | Kroemer | 313/108 |
| 4,802,951 | A | 2/1989 | Clark et al. | 156/630 |
| 5,130,771 | A | * 7/1992 | Burnham et al. | |
| 5,374,564 | A | 12/1994 | Bruel | 437/24 |
| 5,559,822 | A | * 9/1996 | Pankove et al. | 372/250 |
| 5,703,896 | A | 12/1997 | Pankove et al. | 372/50 |
| 2002/0122241 | A1 | * 3/2001 | LoCascio et al. | 359/332 |
| 2002/0123227 | A1 | 9/2002 | Winningham et al. | 438/700 |

FOREIGN PATENT DOCUMENTS

| | | |
|---|---|---|
| FR | 2 681 492 | 9/1991 |
| JP | 8-64910 | * 3/1996 |
| JP | 11-243228 | * 7/1999 |

OTHER PUBLICATIONS

U.S. patent application Ser. No. 09/642,135, filed Aug. 18, 2000.

* cited by examiner

*Primary Examiner*—Savitri Mulpuri
(74) *Attorney, Agent, or Firm*—Holland & Hart LLP; Francis A. Sirr, Esq.

(57) ABSTRACT

A direct-wafer-bonded, double heterojunction, light emitting semiconductor device includes an ordered array of quantum dots made of one or more indirect band gap materials selected from a group consisting of Si, Ge, SiGe, SiGeC, 3C—SiC, and hexagonal SiC, wherein the quantum dots are sandwiched between an n-type semiconductor cladding layer selected from a group consisting of SiC, 3C—SiC, 4H—SiC, 6H—SiC and diamond, and a p-type semiconductor cladding layer selected from a group consisting of SiC, 3C—SiC, 4H—SiC, 6H—SiC and diamond. A Ni contact is provided for the n-type cladding layer. An Al, a Ti or an Al/Ti alloy contact is provided for the p-type cladding layer. The quantum dots have a thickness that is no greater than about 250 Angstroms, a width that is no greater than about 200 Angstroms, and a center-to-center spacing that is in the range of from about 10 Angstroms to about 1000 Angstroms.

14 Claims, 2 Drawing Sheets

250 Å CUBE

US 6,632,694 B2

DOUBLE HETEROJUNCTION LIGHT EMITTING DIODES AND LASER DIODES HAVING QUANTUM DOT SILICON LIGHT EMITTERS

This non-provisional patent application claims the benefit of United States provisional patent application Ser. No. 60/329,882 filed Oct. 17, 2001 entitled METHOD OF MAKING SI BASED LIGHT EMITTING DIODES AND LASER DIODES, incorporated herein by reference.

FIELD OF THE INVENTION

This invention relates to the fabrication of semiconductor devices, and more specifically to the fabrication of silicon-based (Si-based) light emitting diodes (LEDs) and laser diodes (LDs) using nano-patterning and direct wafer bonding techniques.

BACKGROUND OF THE INVENTION

As the term is used herein, direct-wafer-bonding is intended to mean a process whereby two smooth and flat surfaces are brought together, in physical contact, in the absence of an intermediate layer or film, and usually with the application of a uniaxial pressure, such that the two flat surfaces are locally attracted to each other by Van der Walls forces, so that the two flat surfaces stick or bond together. The crystallites in the two flat surfaces of a direct-wafer-bonded interface can fuse together at elevated temperatures due to the surface-energy-induced migration and growth, or the formation of bonds, between the two surface species.

Silicon is a semiconductor of choice for integrated circuits and electronic devices. However, silicon has an indirect bandgap of about 1.1 eV, which makes silicon a relatively inefficient light emitter.

It has been predicted that reducing the physical size of a silicon crystal in all three dimensions, to that of a quantum box or a quantum dot, forces silicon to behave as a direct bandgap material, and therefore become suitable for optical purposes. Moreover, one can tailor the light emission wavelength throughout the visible spectrum by changing the physical dimensions of the silicon quantum dots (Si QDs). For example, see U.S. Pat. Nos. 5,559,822 and 5,703,896, incorporated herein by reference.

One utility of the present invention is to fabricate a double heterostructure (DH) laser diode (LD). A DH LD is described in U.S. Pat. No. 3,309,553, incorporated herein by reference.

The present invention makes use of nano-patterning. The use of bionanomasks as nanometer-scale patterning masks is described in U.S. Pat. No. 4,802,951, incorporated herein by reference.

It is believed that United States patent applications have been filed describing the creation of the nanodot masks, and a technique for tuning the diameter of the nanodots.

DH AlInGaP p-n diodes that are wafer bonded to GaP are typically used for red LEDs (see F. A. Kish et al. *Appl. Phys. Lett.* 64, 2839, 1994), while DH InGaN p-n diodes are used for green, blue and white LEDs (see S. Nakamura and G. Fasol, *The blue laser diode*, Springer, Berlin, 1997).

As described in the publication LONG-WAVELENGTH SEMICONDUCTOR LASERS (G. P. Agrawal and N. K. Dutta, AT&T Bell Laboratories Murray Hill, New Jersey, Van Nostrand Reinhold, New York) it has been suggested that semiconductor lasers might be improved if a layer of one semiconductor material were sandwiched between two cladding layers of another semiconductor material that has a relatively wider band gap. Such a device consisting of two dissimilar semiconductors is commonly referred to as a heterostructure laser, in contrast to single-semiconductor devices called homostructure lasers. Heterostructure lasers are further classified as single-heterostructure or double-heterostructure devices, depending on whether the active region, where lasing occurs, is surrounded on one or both sides by a cladding layer of higher band gap.

FIG. 1 provides an example of a prior art double-heterojunction semiconductor laser 10 having typical dimensions as shown, wherein the hatched area is a thin, about 0.2 micrometer thick, active layer 11 of a semiconductor material whose band gap is slightly lower than that of the two surrounding cladding layers 12 and 13.

SUMMARY OF THE INVENTION

This invention uses direct-wafer-bonding as a fabrication tool to make Si-based light emitters.

In accordance with this invention, a technique known as nano-patterning is used to fabricate, and to control the size of, an ordered array or an ordered matrix of Si QDs, and direct-wafer-bonding provides that a layer of the nano-patterned Si QDs is placed between, or integrated into, two closely adjacent silicon carbide (SiC) cladding/contact layers or wafers, thereby forming a double heterostructure p-n light emitting diode.

The emission wavelength of DH devices in accordance with the invention can be tuned from the infrared part of the spectrum into the ultraviolet part of the spectrum by changing the physical size of the Si QDs.

The invention provides a method of making direct-wafer-bonded, Si-based, DH light emitting diodes (LEDs), and direct-wafer-bonded, Si-based, DH LDs, by sandwiching a layer of Si QDs between two SiC cladding layers or wafers, one SiC cladding layer being an n-type cladding layer, and the other SiC layer being a p-type cladding layer.

SiC is a wide band gap semiconductor, having a band gap energy ranging from about 2.5 to about 3.2 eV, depending upon the polytype, and SiC has an index of refraction (about 2.63) that is smaller than that of Si (about 3.44). The two SiC cladding layers within DH devices in accordance with the invention therefore provide both electrical confinement and optical confinement inside of the Si QDs.

DH devices in accordance with the invention consist of three distinct semiconductor layers, respectively called (1) a wide band gap, n-type, cladding/contact layer, (2) a wide band gap, p-type, cladding/contact layer, (3) and a narrow band gap, nominally indirect band gap, active layer or region that lies between the two wide band gap cladding/contact layers.

More specifically, and in a non-limiting embodiment of the invention, the wide band gap n-type cladding/contact layer is n-SiC, the wide band gap p-type cladding/contact layer is p-SIC, and the narrow and indirect band gap active layer comprises a plurality of Si quantum dots, each quantum dot having a thickness that is no greater than about 250 Angstroms, each quantum dot having a width dimension that is no greater than about 200 Angstroms, and the quantum dots having a center-to-center spacing in the range of from about 10 Angstroms to about 1000 Angstroms. At less than a critical center-to-center spacing, electrons tend to tunnel between adjacent quantum dots.

Direct-wafer-bonded, Si-based, DH LEDs in accordance with this invention can be used for displays and for lighting purposes, while direct-wafer-bonded, Si-based, DH LDs in accordance with this invention are useful for communication, storage, printing purposes and photochemistry.

DETAILED DESCRIPTION

Figure 1:
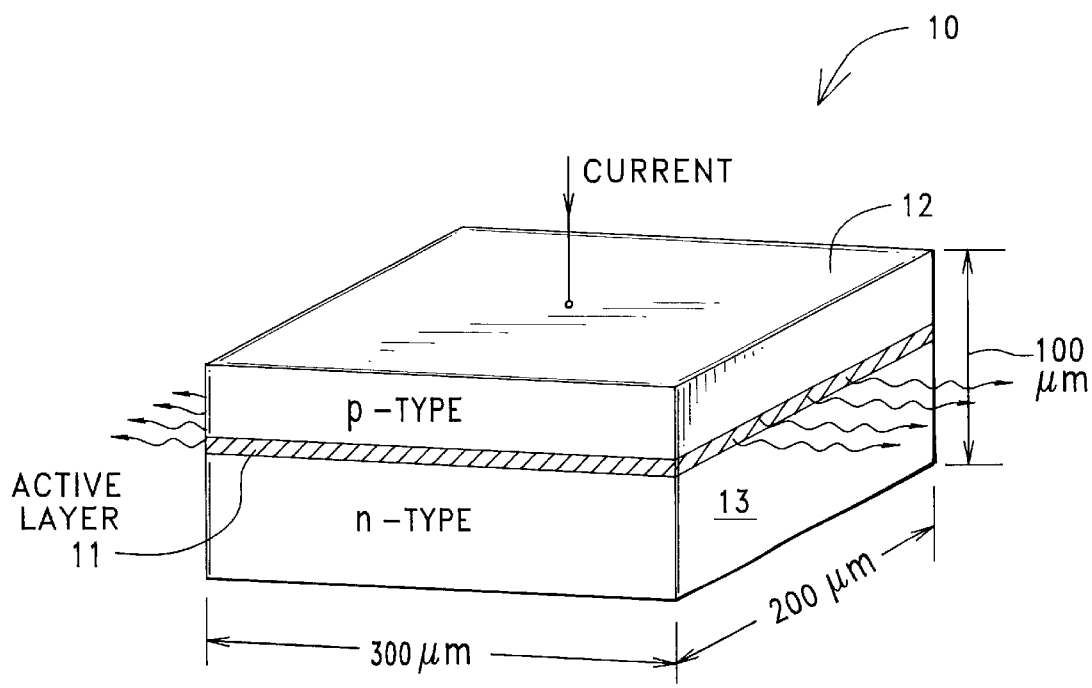
FIG. 1 shows a prior art double-heterojunction semiconductor laser.
Figure 2:
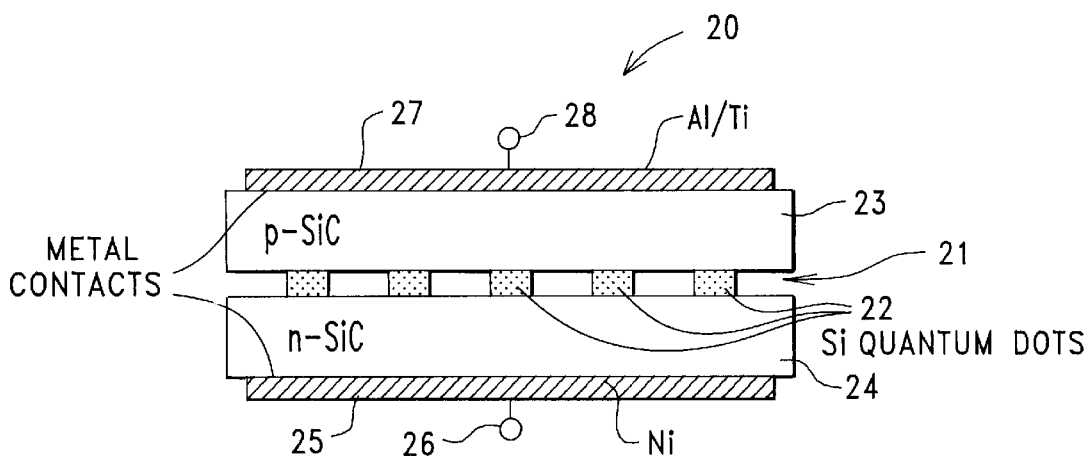
FIG. 2 is a cross sectional schematic view of a Si-based DH LED or a Si-based DH LD in accordance with the invention.

With reference to FIG. 2, a Si-based DH LED or a Si-based DH LD 20 in accordance with this invention includes a thin (no greater than about 250 Angstroms thick) layer 21 having a plurality of narrow band gap Si QDs 22, wherein Si QD layer 21 is sandwiched between a p-type, wide band gap SiC cladding layer 23 and an n-type wide band gap SiC cladding layer 24.

DH device 20 also includes a first metal electrical contact 25 and its electrical connection 26, and a second metal electrical contact 27 and its electrical contact 28. Metal contacts 25 and 27 are preferably alloyed at high temperature, for example over 1000 degrees centigrade, thus assuring good ohmic contact to the DH device 20. Nickel (Ni) can be used to form contact 25, whereas aluminum (Al), titanium (Ti) or a Al/Ti alloy can be used to form contact 27.

The two doped SiC cladding layers 23 and 24 have a wide or large band gap and a small index of refraction, and the two cladding layers 23 and 24 form a type I interface (for example see C. Weisbuch and B. Vinter, Quantum semiconductor structures, Academic Press, London, 1991, page 3) with the narrow or small band gap, thin, and active Si QD layer 21, to thus insure both optical confinement and electrical confinement.

Capacitance-voltage measurements made of DH device 20 confirm that its two SiC/Si structures (i.e. 23/21 and 24/21) indeed form two Type I interfaces that are needed for electrical confinement in a DH structure.

While the thin and active narrow band gap Si QD layer 21 of DH device 20 will be described as including Si quantum dots, within the spirit and scope of the invention other materials such as Ge, a SiGe alloy, a SiGeC alloy, 3C—SiC, or hexagonal SiC can be used to form quantum dot layer 21.

In addition, while cladding layers 23 and 24 will be described as being SiC cladding layers, other materials such as 3C—SiC, 4H—SiC, 6H—SiC or diamond can be used to form cladding layers 23 and 24.

Figure 3:
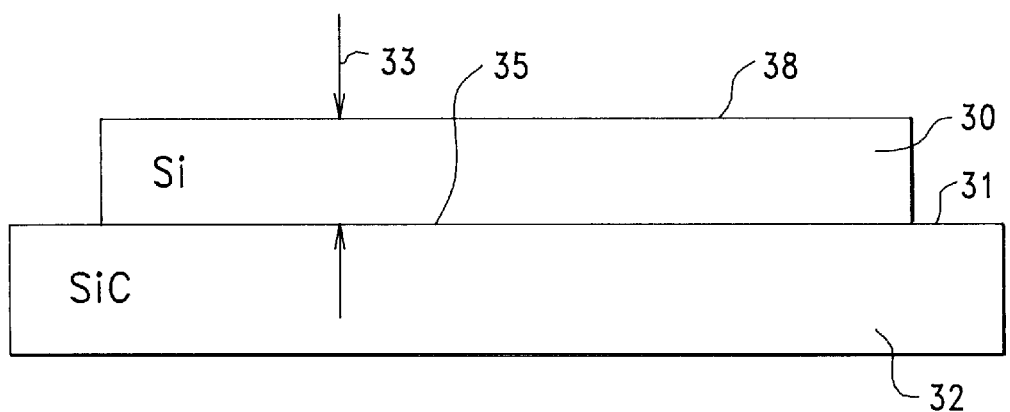
FIG. 3 shows how a Si wafer is direct-wafer-bonded to a SiC wafer prior to reducing the thickness of the Si wafer to no greater than about 250 Angstroms.

With reference to FIG. 3, in the making of FIG. 2's DH device 20, a relatively thick Si wafer 30, having a thickness 33, is first direct-wafer-bonded onto the surface 31 of a SiC wafer 32 which may be either the p-type wafer 23 or the n-type wafer 24 of FIG. 2.

Prior to the direct-wafer-bonding step shown in FIG. 3, the top surface 31 of SiC wafer 32 and the bottom surface 35 of Si wafer 30 are processed to produce surface characteristics that facilitate the direct-wafer-bonding of these two wafer surfaces. That is, the two mating surfaces 31 and 35 of wafers 32 and 30 are prepared for direct-wafer-bonding, as is well known to those skilled in the art. Generally, the two surfaces 31 and 35 must be clean, they must be flat, and these two surfaces do not contain an intermediate material such as an oxide, such that direct-wafer-bonding can be achieved.

Figure 4:
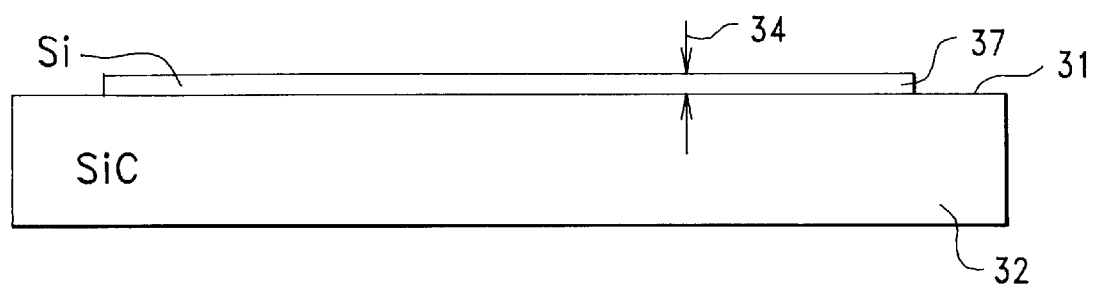
FIG. 4 shows the assembly of FIG. 3 after the thickness of the Si wafer has been reduced.

In FIG. 4 the FIG. 3 thickness 33 of Si wafer 30 has been reduced to produce a thin slice of Si 37 that is no more that about 250 Angstroms thick, this being dimension 34 of FIG. 4. As stated, SiC wafer 32 of FIG. 4 can be either the n-doped cladding layer 24 of FIG. 2 or the p-doped cladding layer 23 of FIG. 2.

In FIG. 4, the thickness 33 of FIG. 3's Si wafer 30 has been reduced, for example by etching or by polishing the top surface 38 of FIG. 3's Si wafer 30, to a desired thickness 34 of no more than about 250 Angstroms, and preferably considerably less than 250 Angstroms.

FIG. 4's thin Si slice 37 can also be accomplished using a process known as SMARTCUT®, a process for separating a thin membrane from a bulk substrate, for example as described in French Patent 2,681,472 and U.S. Pat. No. 5,374,564, incorporated herein by reference.

In addition, the relatively thick Si wafer 30 of FIG. 3 can be produced on FIG. 3's surface 31 by direct-wafer-bonding a Si SIMOX (separation by implantation of oxygen) wafer onto the surface 31 of SiC wafer 32, followed by etching the $SiO_2$ layer and thereby transferring the top Si layer of the SIMOX wafer to the SiC to a thickness 34 that is no more that about 250 Angstroms. This thin Si layer is then etched to produce the quantum dots. Such a SIMOX process makes use of high oxygen dose implantation in a silicon substrate for creating in the silicon substrate a silicon oxide layer that separates a monocrystalline silicon film from the substrate.

As an alternate to the direct-wafer-bonded embodiment of FIGS. 3 and 4, the relatively thin Si layer 37 of FIG. 4 can be grown on the FIG. 3 surface 31 of SiC wafer 32 to a thickness 34 that is less than the critical thickness, to thereby avoid stress related to defect formation in Si layer 37.

Figure 5:
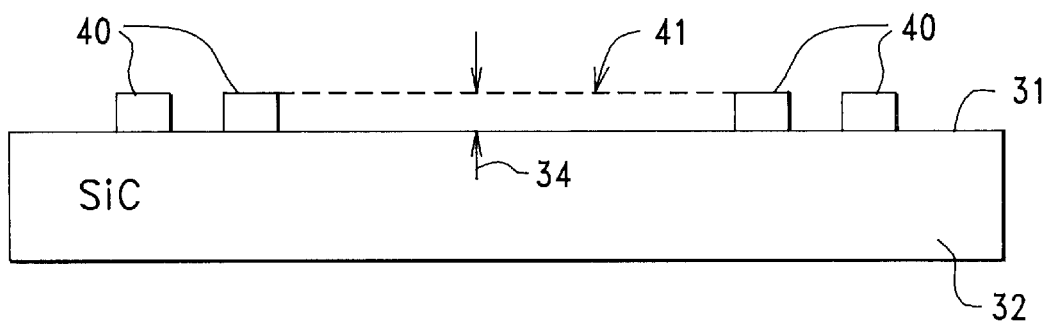
FIG. 5 shows the assembly of FIG. 4 wherein a plurality of quantum dots have been formed in the reduced-thickness Si wafer of FIG. 4, each of the quantum dots having a height dimension that is no greater than about 250 Angstroms and a width dimension that is no greater than about 200.

As the next step in producing DH device 20 of FIG. 2, FIG. 4's thin Si layer 37 (now thinned to no more than about 250 Angstroms, as above described) is patterned into a plurality of quantum dots or boxes 40, as is shown in FIG. 5. The top surfaces of the plurality of quantum dots 40 all lie in a plane 41 that is spaced no more than about 250 Angstroms above the plane that is formed by the surface 31 of SiC wafer 32, wherein plane 41 is generally parallel to plane 31.

Quantum dots 40 are preferably controlled to have a three-dimensional size that is no greater than about 250 Angstroms by about 200 Angstroms. The center-to-center spacing of quantum dots 40 is in the range of from about 10 Angstroms to about 1000 Angstroms.

Quantum dots 40 are preferably produced using inductively coupled plasma (ICP) etching and metal nanodot masks that are created using biomolecular nanomask (bionanomask) technology (for example see T. A. Winningham, Steven G. Whipple and Kenneth Douglas, "Pattern Transfer from a biomolecular nanomask to a substrate via an intermediate transfer layer," J. Vac, Technol B 19(5), September/October 2001).

Using bionanomasks and ICP etching, nano-pattering of FIG. 4's thin Si layer 37 to form FIG. 5's quantum dots 40 has been demonstrated by creating an ordered array of quantum dots 40 having about a 5-nanometer (nm) diameter and having a center-to-center spacing of about 22 nm.

As an alternative to the above procedure of forming the FIG. 5 array of quantum dots 40, a bionanomask can be deployed on a native $SiO_2$ layer that exists on the top surface 38 of FIG. 3's Si wafer 30, to thereby create an ordered array or mask of metal nanodots that is the inverse of the FIG. 5 array of quantum dots 40. This $SiO_2$ layer is removed later, during subsequent direct-wafer-bonding of a second SiC cladding layer to the FIG. 3 assembly, thereby removing the metal nanodot mask, and thereby leaving the FIG. 5 array of quantum dots 40.

Processing-induced damage on the top and generally flat surface 41 of the quantum dots 22 can be removed by chemical etching in potassium hydroxide (KOH), or by growing and then etching off a sacrificial $SiO_2$ layer.

As a third step in a process of making FIG. 2's DH device 20 a second SiC cladding layer or wafer (similar to SiC wafer 32 of FIG. 3) is direct-wafer-bonded to the top surface 41 of the quantum dots 40 shown in FIG. 5 (i.e. to the two-layer SiC/Si QD structure shown in FIG. 5), thus completing the three-layer SiC/Si-QD/SiC p-n structure 20 that is shown in FIG. 2.

Passivation of the FIG. 2 device can then be achieved using thermal or deposited oxides.

The interface between FIG. 2's SiC cladding layer 23 and Si quantum dots 22, and the interface between SiC cladding layer 24 and Si quantum dots 22, can include both polarities (Si—C or Si—Si), and wafers 23 and 24 can be wafers that are cut on and/or off the (0001) axis.

In accordance with this invention, highly reproducible and direct-wafer-bonding of n-type 4H—SiC and p-type 6H—SiC cladding layers to an Si QD array 21 (either undoped, p-doped, or n-doped) can be achieved, thus producing direct-wafer-bonded interfaces that have a high bond strength and high quality.

Direct-wafer-bonding using both polarities of SiC (Si—C and Si—Si), and using SiC wafers cut on-axis and off-axis, was also achieved in accordance with the invention.

The surface morphology and surface preparation procedures that are used to form the above-described direct-wafer-bonded interfaces are important elements of the direct-wafer-bonding process. For example, the root-mean-squared surface roughness of the two surfaces that are to be direct-wafer-bonded should be better than about 10 Angstroms, as measured by atomic force microscopy, which minimal surface roughness can be had by polishing and by in-situ hydrogen etching at high temperatures (above 1000 degrees centigrade). Growing an oxide on the two surfaces that are to be direct-wafer-bonded, and subsequently etching the oxide off of these two surfaces in hydrofluoric acid, also improves the morphology of the two surfaces.

A key issue when direct-wafer-bonding SIC and Si for vertical device structures such as shown in FIG. 2 is that both of these semiconductor materials readily oxidize in air. This oxide needs to be removed, and thus the direct-wafer-bonding should take place in an inert or a reducing atmosphere.

Standard surface preparation prior to direct-wafer-bonding includes the use of sacrificial oxides followed by solvent, RCA, (see W. Kern, D. A. Puotinen *RCA Review*, page 187, June 1970) and hydrofluoric acid cleaning.

DH devices in accordance with the invention were direct-wafer-bonded using both hydrophilic and hydrophobic surfaces.

Direct-wafer-bonding was performed using an all-graphite wafer bonder that provided chemical stability and uniform thermal expansion at high temperatures, and that provided a way in which to apply known calibrated and uniaxial pressures to the two wafers to be direct-wafer-bonded.

By way of example, direct-wafer-bonding was accomplished by applying a pressure up to about 600 psi and annealed for up to about 60 minutes at from about 700 degrees centigrade to about 1000 degrees centigrade in both inert (nitrogen and argon) and reducing atmospheres (forming gas), to thereby solidify the direct-wafer-bond.

This invention has been described in detail while making reference to preferred embodiments of the invention. However, it is known that others skilled in the art will, upon learning of the invention, readily visualize yet other embodiments that are within the spirit and scope of the invention. Thus, this detailed description is not to be taken as a limitation on the spirit and scope of the invention.

What is claimed is:

1. A method of making a double heterojunction light emitting semiconductor device, comprising the steps of:

providing an n-type semiconductor cladding layer selected from a group consisting of SiC, 3C—SiC, 4H—SiC, 6H—SiC and diamond;

said n-type cladding layer having an outer surface and a first generally flat surface;

providing a plurality of quantum dots on said first generally flat surface;

said quantum dots being formed of one or more indirect band gap materials selected from a group consisting of Si, Ge, SiGe, SiGeC, 3C—SiC, and hexagonal SiC, each of said quantum dots having a thickness measured generally perpendicular to said first generally flat surface that is no greater than about 250 Angstroms, and said plurality of quantum dots defining a second generally flat surface that is spaced from and generally parallel to said first generally flat surface;

processing said second generally flat surface to produce surface-characteristics that are compatible with direct-wafer-bonding;

providing a p-type semiconductor cladding layer selected from a group consisting of SiC, 3C—SiC, 4H—SiC, 6H—SiC and diamond;

said p-type cladding layer having an outer surface and having a third generally flat surface;

processing said third generally flat surface to produce a surface-characteristic that is compatible with direct-wafer-bonding;

direct-wafer-bonding said second generally flat surface to said third generally flat surface;

providing a first metal contact on said outer surface of said n-type cladding layer; and providing a second metal contact on said outer surface of said p-type cladding layer.

2. The method of claim 1 wherein said first metal contact is Ni and wherein said second metal contact is an Al/Ti alloy.

3. The method of claim 1 wherein said plurality of quantum dots form an ordered array of quantum dots, each quantum dot having a dimension measured parallel to said second generally flat surface that is no greater than about 200 Angstroms, and said plurality of quantum dots having a center-to-center spacing in a range of from about 10 Angstroms to about 1000 Angstroms.

4. The method of claim 1 wherein said n-type cladding layer is SiC, and wherein said p-type cladding layer is SiC.

5. The method of claim 4 wherein said plurality of quantum dots form an ordered array of quantum dots, each quantum dot have a dimension measured parallel to said second generally flat surface that is no greater than about 200 Angstroms, and said plurality of quantum dots having a center-to-center spacing in a range of from about 10 Angstroms to about 1000 Angstroms.

6. The method of claim 3 wherein said n-type cladding layer is 4H—SiC, and wherein said p-type cladding layer is 6H—SiC.

7. The method of claim 6 wherein said plurality of quantum dots form an ordered array of quantum dots, each quantum dot having a dimension measured parallel to said second generally flat surface that is no greater than about 200 Angstroms, and said plurality of quantum dots having a center-to-center spacing in a range of from about 10 Angstroms to about 1000 Angstroms.

8. The method of claim 3 wherein said step of providing a plurality of quantum dots on said first generally flat surface of said n-type cladding layer includes the steps of:

processing said first surface of said n-type cladding layer to produce a surface-characteristic that is compatible with direct-wafer-bonding;

providing a relatively thick wafer that is formed of one or more indirect band gap materials selected from said group consisting of Si, Ge, SiGe, SiGeC, 3C—SiC, and hexagonal SiC;

processing a first surface of said relatively thick wafer to produce a surface-characteristic that is compatible with direct-wafer-bonding;

direct-wafer-bonding said first surface of said relatively thick wafer to first surface of said n-type cladding layer;

reducing a thickness of said relatively thick wafer to no greater than about 250 Angstroms; and using nano-pattern masking techniques to form said quantum dots in said reduced thickness wafer.

9. A method of making a double heterojunction light emitting semiconductor device comprising the steps of:

providing a first cladding layer of a first-doping selected from a group consisting of SiC, 3C—SiC, 4H—SiC, 6H—SiC and diamond;

said first cladding layer having an outer surface and a first generally flat surface;

growing a semiconductor layer of one or more indirect band gap materials selected from a group consisting of Si, Ge, SiGe, SiGeC, 3C—SiC, and hexagonal SiC, on said first generally flat surface to a thickness that is no greater than about 250 Angstroms;

patterning said grown semiconductor layer to form a plurality of quantum dots therein whose top surfaces define a second generally flat surface that is spaced from and generally parallel to said first generally flat surface;

processing said second generally flat surface to produce surface-characteristics that are compatible with direct-wafer-bonding;

providing a second cladding layer having a second-doping selected from a group consisting of SiC, 3C—SiC, 4H—SiC, 6H—SiC and diamond;

said second cladding layer having an outer surface and having a third generally flat surface;

processing said third generally flat surface to produce a surface-characteristic that is compatible with direct-wafer-bonding;

direct-wafer-bonding said second generally flat surface to said third generally flat surface;

providing a first metal contact on said outer surface of said first cladding layer; and providing a second metal contact on said outer surface of said second cladding layer.

10. The method of claim 9 including the step of:

removing process-induced damage from said second surface of said quantum dots.

11. The method of claim 9 wherein said plurality of quantum dots form an ordered array of quantum dots, each quantum dot having a dimension measured parallel to said second generally flat surface that is no greater than about 200 Angstroms, and said plurality of quantum dots having a center-to-center spacing in a range of from about 10 Angstroms to about 1000 Angstroms.

12. A method of making a double heterojunction light emitting semiconductor device comprising the steps of:

providing a first cladding layer having a first-doping and selected from a group consisting of SiC, 3C—SiC, 4H—SiC, 6H—SiC and diamond;

said first cladding layer having an outer surface and a generally flat surface;

providing a light-emitting semiconductor layer having a thickness that is no greater than about 250 Angstroms, having a first surface, and having a second surface;

said light-emitting layer being formed of one or more indirect band gap materials selected from a group consisting of Si, Ge, SiGe, SiGeC, 3C—SiC, and hexagonal SiC;

direct-wafer-bonding said first surface of said light-emitting semiconductor layer to said generally flat surface of said first cladding layer;

patterning said light-emitting semiconductor to form a plurality of quantum dots therein;

providing a second cladding layer having a second-doping and selected from a group consisting of SiC, 3C—SiC, 4H—SiC, 6H—SiC and diamond;

said second cladding layer having an outer surface and having a generally flat surface;

direct-wafer-bonding said generally flat surface of said second cladding layer to said second surface of said light-emitting semiconductor layer;

providing a first metal contact on said outer surface of said first cladding layer; and providing a second metal contact on said outer surface of said second cladding layer.

13. The method of claim 12 including the step of:

removing process-induced damage from said second surface of said quantum dots.

14. The method of claim 12 wherein said plurality of quantum dots form an ordered array of quantum dots, each quantum dot having a dimension measured parallel to said second generally flat surface that is no greater than about 200 Angstroms, and said plurality of quantum dots having a center-to-center spacing in a range of from about 10 Angstroms to about 1000 Angstroms.

* * * * *